(12) United States Patent
Takahara et al.

(10) Patent No.: US 9,064,918 B2
(45) Date of Patent: Jun. 23, 2015

(54) ARTICLE STORAGE FACILITY AND ARTICLE STORAGE METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 360 days.

(21) Appl. No.: 13/731,568

(22) Filed: Dec. 31, 2012

(65) Prior Publication Data

US 2014/0014225 A1    Jan. 16, 2014

(30) Foreign Application Priority Data

Jan. 4, 2012  (JP) ................................ 2012-000205

(51) Int. Cl.
*H01L 21/67*    (2006.01)
*H01L 21/673*   (2006.01)
*H01L 21/677*   (2006.01)

(52) U.S. Cl.
CPC .... *H01L 21/67393* (2013.01); *H01L 21/67389* (2013.01); *H01L 21/67769* (2013.01)

(58) Field of Classification Search
CPC .................. H01L 21/67769; H01L 21/67389; H01L 21/67393
See application file for complete search history.

(56) References Cited

U.S. PATENT DOCUMENTS

| 6,123,120 A * | 9/2000 | Yotsumoto et al. ............. 141/65 |
| 7,077,173 B2 * | 7/2006 | Tokunaga ........................ 141/66 |
| 7,134,825 B1 * | 11/2006 | Schmutz et al. ........... 414/217.1 |
| 8,240,346 B2 * | 8/2012 | Goto et al. ....................... 141/65 |
| 8,926,251 B2 * | 1/2015 | Iizuka et al. .................. 414/217 |
| 8,942,844 B2 * | 1/2015 | Takahara et al. .............. 700/214 |
| 2010/0000625 A1 | 1/2010 | Goto et al. |

FOREIGN PATENT DOCUMENTS

| JP | 6183511 A | 7/1994 |
| JP | 2001338971 A | 12/2001 |
| JP | 2004119488 A | 4/2004 |
| JP | 2008100805 A | 5/2008 |
| JP | 201016199 A | 1/2010 |
| JP | 2010182747 A | 8/2010 |

* cited by examiner

*Primary Examiner* — Timothy L Maust
*Assistant Examiner* — Timothy P Kelly
(74) *Attorney, Agent, or Firm* — The Webb Law Firm

(57) ABSTRACT

An article storage facility includes a controller for controlling operations of flow rate adjusting devices of inactive gas feeding sections and a specified feeding section selecting section for selecting one or some or all of a plurality of inactive gas feeding sections as specified feeding sections. For the inactive gas feeding sections of the storage sections storing the transport containers therein, the controller causes the flow rate adjusting devices to be operated according to a container storage mode in which mode the inactive gas is fed to the transport container in a predetermined feed manner. For the specified feeding sections selected by the specified feeding section selecting section, the controller causes the flow rate adjusting devices to be operated according to a specified feeding section feed mode in which mode the inactive gas is fed through the discharge openings thereof in a specified feeding section feed manner.

16 Claims, 9 Drawing Sheets

ARTICLE STORAGE FACILITY AND ARTICLE STORAGE METHOD

FIELD OF THE INVENTION

The present invention relates to an article storage facility including a plurality of storage sections each storing therein a transport container accommodating a substrate therein, a transport device for transporting the transport containers to the plurality of storage sections, an inactive gas feeding section for feeding an inactive gas to the inside of the transport container accommodated in the storage section, and a controller for controlling the operation of the transport device and the operation of a flow rate adjusting device of the inactive gas feeding section. The invention relates also to an article storage method utilizing such article storage facility.

BACKGROUND

As an example of such article storage facility described above, there is known an article storage facility having an article storage shelf with a purging function described below. This article storage shelf includes a plurality of storage sections for storing a transport container such as an FOUP, etc. accommodating a semiconductor wafer. Each storage section is provided with a feed nozzle as the inactive gas feeding section for feeding inactive gas such as nitrogen gas, argon gas, etc. to the inside of the transport container.

Japanese Unexamined Patent Application Publication No. 2010-16199 (Patent Document 1) discloses an example of such article storage facility. With this article storage facility, the flow rate of inactive gas to be discharged from the feed nozzle is varied between a case when a transport container is stored in the storage section and a case when no transport container is stored in the storage section.

More particularly, in Patent Document 1, an arrangement is provided such that the flow rate of inactive gas in the case of no transport container being stored in the storage section is set smaller (lower) than that in the case of a transport container being stored in the storage section. That is, the inactive gas flow rate in the case of a transport container being stored in the storage section is set to a flow rate (this is referred to as "a first flow rate") required for feeding a sufficient amount of inactive gas into the transport container. Whereas, the discharging flow rate in the case of no transport container being stored in the storage section is set to a flow rate (this is referred to as "a second flow rate") smaller than the first flow rate described above in order to prevent unwanted accumulation of impurity particles on the feed nozzle. With this arrangement, as compared with the case of discharging inactive gas at the first flow rate from the feed nozzle in the case also of no transport container being stored in the storage section, the consumption amount of inactive gas required for purging can be restricted, thus achieving cost reduction.

However, in Patent Document 1 above, the inactive gas is fed in a single feed manner that switches over the condition of feeding inactive gas at the first flow rate and the condition of feeding it at the second flow rate uniformly for all of the storage sections of the storage shelf. And, the flow rate of inactive gas in the case of no transport container being stored is set to the second flow rate which is a relatively small flow rate. For this reason, if a feed nozzle or the like as the inactive gas feeding section has been replaced and then an amount of inactive gas is to be fed therethrough for removing any impurity particles accumulated in this inactive gas feeding section, as the flow rate of the inactive gas is set to the second flow rate, the small amount of flow rate of inactive gas makes sufficient cleaning of the inactive gas feeding section impossible; or even it is possible, it will take a long time until sufficient removal of impurity particles is achieved.

SUMMARY OF THE INVENTION

In view of the above-described manner of the art, there is a need for realizing an article storage facility that facilitates feeding of the required amount of inactive gas to each individual storage section.

An article storage facility, according to the present invention, comprises:

a plurality of storage sections each storing a transport container accommodating a substrate therein;

a transport device for transporting the transport containers to the plurality of storage sections;

an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting the flow rate of the inactive gas to be discharged via the discharge opening;

a controller for controlling operations of the transport device and the flow rate adjusting device; and a specified feeding section selecting section for selecting one or some or all of the plurality of inactive gas feeding sections as specified feeding sections;

wherein for the inactive gas feeding sections of the storage sections storing the transport containers therein, the controller causes the flow rate adjusting devices to be operated according to a container storage mode in which mode the inactive gas is fed to the transport container in a predetermined feed manner; and for the specified feeding sections selected by the specified feeding section selecting section, the controller causes the flow rate adjusting devices to be operated according to a specified feeding section feed mode in which mode the inactive gas is fed through the discharge openings thereof in a specified feeding section feed manner.

With the above-described arrangement, of the plurality of inactive gas feeding sections, in the specified feeding sections selected by the specified feeding section selecting section, the inactive gas can be fed in the feed manner suited for these specified feeding sections, different from the feeding manner in the container storage mode.

More particularly, in the case of the arrangement that allows the inactive gas feeding operation of the inactive gas feeding sections according to only the container storage mode, it is not possible to feed the necessary flow rate of inactive gas in the inactive gas feeding sections that require a greater or smaller flow rate than the flow rate in the container storage mode.

In contrast, the inventive arrangement described above allows feeding of inactive gas in the specified feeding sections in the specified feeding section feed manner. So that, with setting of the inactive gas feed manner required by the specified feeding sections as the specified feeding section feed manner, it is possible to restrict occurrence of the above-described inconvenient situation which prevents feeding of inactive gas at the flow rate required by the specified feeding sections.

Namely, with the above-described inventive arrangement, it is possible to change the inactive gas feed manner for the inactive gas feeding sections selected from the plurality of inactive gas feeding sections. As a result, it has become possible to provide an article storage facility that facilitates feeding of the required amount of inactive gas to each individual storage section.

The above-described technical feature of the article storage facility relating to the present invention can be applied to and claimed for an article storage method which also relates to the present invention. With this article storage method too, the advantageous function/effects made possible by the article storage facility can be achieved.

Namely, an article storage method according to the present invention, utilizing an article storage facility comprising:

a plurality of storage sections each storing a transport container accommodating a substrate therein;

a transport device for transporting the transport containers to the plurality of storage sections;

an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting the flow rate of the inactive gas to be discharged via the discharge opening;

a controller for controlling operations of the transport device and the flow rate adjusting device; and a specified feeding section selecting section for selecting one or some or all of the plurality of inactive gas feeding sections as specified feeding sections;

wherein the method comprises the following steps as steps executed by the controller;

a first feeding step executed for the inactive gas feeding sections of the storage sections storing the transport containers therein for causing the flow rate adjusting devices to be operated according to a container storage mode in which mode the inactive gas is fed to the transport container in a predetermined feed manner; and a second feeding step executed for the specified feeding sections selected by the specified feeding section selecting section for causing the flow rate adjusting devices to be operated according to a specified feeding section feed mode in which mode the inactive gas is fed through the discharge openings thereof in a specified feeding section feed manner.

Next, preferred embodiments of the invention will be explained.

According to a preferred embodiment of the article storage facility relating to the present invention, the manner of feeding the inactive gas through the inactive gas feeding section for cleaning thereof is a cleaning feed manner; and the specified feeding section selecting section comprises a cleaning commanding device for commanding manually a cleaning command for feeding the inactive gas in the cleaning feed manner.

With the above arrangement, when the cleaning command is issued from the cleaning commanding device, in the specified feeding sections as the inactive gas feeding sections to be cleaned, the inactive gas is caused to be fed at the flow rate capable of cleaning these sections appropriately, so that these inactive gas feeding sections can be cleaned appropriately.

According to a further preferred embodiment of the article storage facility relating to the present invention, the controller is configured to be switchable between a first feed state for operating the flow rate adjusting device to adjust the feed rate of the inactive gas feeding section to a first target flow rate value and a second feed state for operating the flow rate adjusting device to adjust the feed rate of the inactive gas feeding section to a second target flow rate value which is smaller than the first target flow rate value; and when the transport container is transported to the storage section, the operation of the flow rate adjusting device is controlled in the inactive gas feeding section of the storage section according to a saving feed pattern in which the first feed state is set from the timing of completion of storage of the transport container in the storage section as the starting point and the second feed state is set thereafter.

With the above-described arrangement, as the first feed state is set from the timing of completion of storage of the transport container in the storage section as the starting point, at the early stage immediately following the storage of the transport container in the storage section, a gas present in the transport container other than and separately from the inactive gas will be replaced by the inactive gas speedily; and thereafter, as the feed manner is switched over to the second feed state, whereby the amount of inactive gas (e.g. nitrogen gas, etc.) which is expensive used can be reduced.

In this way, with the above-described arrangement, it is possible to appropriately maintain the condition of lower risk of substrate contamination while restricting the use amount of the inactive gas.

According to a further preferred embodiment of the article storage facility relating to the present invention, the controller is configured to be capable of memorizing a plurality of kinds of saving feed patterns;

there is provided a pattern selecting section for selecting which one of the plurality of kinds of saving feed patterns is to be used under the storage condition of the transport container: and the controller is configured to control the operation of the flow rate adjusting device according to a saving feed pattern selected by the pattern selecting section from the plurality of kinds of saving feed patterns.

With the above-described arrangement, in comparison with a case wherein the controller memorizes only a single saving feed pattern, it is possible to feed the inactive gas with using an appropriate pattern suited to the type of the transport container and/or the state of the substrate accommodated therein.

Incidentally, as such arrangement for selecting which one of the plurality of kinds of saving feed patterns is to be used, there are conceivable an arrangement of automatic selection by the controller and an arrangement of selection by manual operation.

As an example of the arrangement of automatic selection by the controller, it is conceivable to arrange such that the feed pattern is selectively switched to an appropriate saving feed pattern of the plurality of saving feed patterns, based on the type of the transport container or the state of the substrate accommodated therein. Further, as an example of the arrangement of selection by manual operation, it is conceivable to arrange such that the feed pattern is experimentally switched to a saving feed pattern as a saving feed pattern suitable for rendering the environment inside the transport container to an inside environment with lower risk of contamination.

In this way, with the above-described inventive arrangement, the feed pattern can be selectively switched among a plurality of kinds of saving feed patterns. Hence, it becomes possible to feed the inactive gas according to a saving feed pattern advantageous for the substrate accommodated in the transport container while minimizing the use amount of the inactive gas. So that, it becomes possible to store the substrate accommodated in the transport container under a condition with minimal possibility of deterioration thereof.

According to a further preferred embodiment of the article storage facility relating to the present invention, the pattern selecting section is configured to allow manual selection of which one of the plurality of kinds of saving feed pattern is to be used.

With the above-described arrangement, the user or worker can change the saving feed pattern at a necessary timing, so that experiment for checking the relationship between the saving feed pattern and damage or contamination of the substrate will be facilitated.

According to a still further preferred embodiment of the article storage facility relating to the present invention, there is provided a setting input device for manually setting and inputting pattern specifying parameters for specifying the saving feed pattern, the pattern specifying parameters allowing variable setting of a feed period of feeding the inactive gas to the transport container from the inactive gas feeding section and a feed flow rate for feeding the inactive gas to the transport container from the inactive gas feeding section.

With the above-described arrangement, in comparison with an arrangement of simply selecting a target feed pattern from the plurality of kinds of saving feed patterns, an appropriate saving feed pattern can be set with varying the pattern specifying parameters as needed.

According to a still further preferred embodiment of the article storage facility relating to the present invention, a feed source of the inactive gas is provided to feed the inactive gas to a group of the inactive gas feeding sections corresponding to a group of storage sections of the plurality of storage sections;

there is set a maximum allowable flow rate that can be fed from the feed source to the group of inactive gas feeding sections; and the controller is configured to execute a flow rate restricting process for reducing the target flow rates of the inactive gas for one or some or all of the group of inactive gas feeding sections in case the total of the target flow rates of the inactive gas for the group of inactive gas feeding sections exceeds the maximum allowable flow rate.

For instance, in case the total of the target flow rates of the inactive gas set respectively to the group of inactive gas feeding sections exceeds the maximum allowable flow rate that can be fed to group of inactive gas feeding sections from the feed source, there is the possibility that the flow rate of inactive gas that can be actually fed by each of the group of inactive gas feeding sections may fall short of the set target flow rate.

Further, in case inactive gas feeding section(s) having a large piping resistance from the feed source to the inactive gas feeding section(s) and inactive gas feeding section(s) having a small such resistance coexist, there is the possibility that the inactive gas fed from the feed source is caused to flow with priority to the inactive gas feeding section(s) having the small resistance and the flow rate to the inactive gas feeding section(s) having the large resistance may fall short of the target flow rate.

With the above-described arrangement, in case the total of the target flow rates of the inactive gas set respectively to the group of inactive gas feeding sections exceeds the maximum allowable flow rate, the flow rate restricting process is executed, so that to the flow rate adjusting devices for one or some or all of the group of inactive gas feeding sections, new target flow rates smaller than the previous respective target flow rates will be issued. With this, the discharge amounts of the inactive gas discharged from one or some or all of the inactive gas feeding sections will be reduced. Hence, it is possible to circumvent the situation where the discharge flow rate of the inactive gas from each inactive gas feeding section falls short of the target flow rate commanded to the discharge flow rate adjusting device by the controller.

Incidentally, there may be provided a function of outputting an error when the flow rate adjusting device controlled so as to feed the inactive gas at the target flow rate commanded by the controller continues to operate under a condition wherein the actually fed flow rate is lower than the target flow rate (this condition will be referred to as "flow rate shortage condition"). In such case too, with the above-described arrangement, the controller will issue a command to the flow rate adjusting device so as to reduce the target flow rates of the inactive gas for one or some or all of the group of inactive gas feeding sections before occurrence of the flow rate shortage condition. Hence, the occurrence of the error can be restricted and the facility can be operated normally.

Namely, with the above-described flow rate adjusting device, there is the risk that even in the absence of any failure in the device per se, an error may occur due to the flow rate shortage condition resulting from issuance of request for a flow rate exceeding the feeding capacity of the feed source. With the above-described arrangement, as the control is executed such that the total of the target flow rates of the inactive gas set according to the saving feed pattern for the group of inactive gas feeding sections is confined below the maximum allowable flow rate that can be fed from the feed source to the group of inactive gas feeding sections. Therefore, it is possible to prevent output of unnecessary error by the flow rate adjusting device, so that the operation of the device may proceed smoothly.

Incidentally, a further arrangement may be provided as follows. Namely, when the total of the target flow rates of the inactive gas set according to the saving feed rate for the group of inactive gas feeding sections exceeds the maximum allowable flow rate that can be fed from the feed source to the group of inactive gas feeding sections and an error is issued as a result thereof, the controller issues a command to the flow rate adjusting devices so as to reset the error and also to reduce the target flow rates for one or some or all of the group of inactive gas feeding sections.

In the case of selective switchover among the plurality of kinds of saving feed patterns or variable setting of the pattern specifying parameters for the saving feed patterns, it may occur that the total of the target flow rates set respectively to the individual inactive gas feeding sections belonging in the group of inactive gas feeding sections may be set to a value greater than that prior to the switchover or the variable setting. In such case, even if the total of the target flow rates prior to the switchover or the variable setting is confined below the maximum allowable flow rate, this total of flow target flow rates may exceed the maximum allowable flow rate after the switchover or the variable setting. In view of this, the above-described inventive arrangement of reducing the target flow rates of one or some or all of the group of inactive gas feeding sections will be particularly effective.

According to a further preferred embodiment of the article storage facility relating to the present invention, the controller is configured to reduce the target flow rates for all of the group of inactive gas feeding sections by a fixed reduction ratio.

With the above-described arrangement, it is possible to avoid the situation of the discharge flow rate of inactive gas from each inactive gas feeding section falling short of the target flow rate commanded to the discharge flow rate adjusting device by the controller, with the simple arrangement without regard to the feed state of the inactive gas in the inactive gas feeding sections.

According to a preferred embodiment of an article storage method relating to the present invention, the manner of feeding the inactive gas through the inactive gas feeding section for cleaning thereof is a cleaning feed manner; and the specified feeding section selecting section comprises a cleaning commanding device for commanding manually a cleaning command for feeding the inactive gas in a cleaning feed manner.

According to a further preferred embodiment of the article storage method relating to the present invention, the controller is configured to be switchable between a first feed state for operating the flow rate adjusting device to adjust the feed rate of the inactive gas feeding section to a first target flow rate value and a second feed state for operating the flow rate adjusting device to adjust the feed rate of the inactive gas feeding section to a second target flow rate value which is smaller than the first target flow rate value; and at the first feeding state, when the transport container is transported to the storage section, the operation of the flow rate adjusting device is controlled in the inactive gas feeding section of the storage section, according to a saving feed pattern in which the first feed state is set from the timing of completion of accommodation of the transport container in the storage section as the starting point and the second feed state is set thereafter.

According to a further preferred embodiment of the article storage method relating to the present invention, the controller is configured to be capable of memorizing a plurality of kinds of saving feed pattern;

there is provided a pattern selecting section for selecting which one of the plurality of kinds of saving feed patterns is to be used under the storage condition of the transport container: and at the first feeding step, the operation of the flow rate adjusting device is controlled according to a saving feed pattern selected by the pattern selecting section from the plurality of kinds of saving feed patterns.

According to a further preferred embodiment of the article storage method relating to the present invention, the pattern selecting section is configured to allow manual selection of which one of the plurality of kinds of saving feed pattern is to be used.

According to a still further preferred embodiment of the article storage method relating to the present invention, the article storage facility further includes a setting input device for manually setting and inputting pattern specifying parameters for specifying the saving feed pattern, the pattern specifying parameters allowing variable setting of a feed period of feeding the inactive gas to the transport container from the inactive gas feeding section and a feed rate for feeding the inactive gas to the transport container from the inactive gas feeding section.

According to a still further preferred embodiment of the article storage method relating to the present invention, the article storage facility further includes a feed source of the inactive gas to feed the inactive gas to a group of the inactive gas feeding sections corresponding to a group of storage sections of the plurality of storage sections;

there is set a maximum allowable flow rate that can be fed from the feed source to the group of inactive gas feeding sections; and at the first feeding step, a flow rate restricting process for reducing the target flow rates of the inactive gas for one or some or all of the group of inactive gas feeding sections is executed in case the total of the target flow rates of the inactive gas for the group of inactive gas feeding sections exceeds the maximum allowable flow rate.

According to a further preferred embodiment of the article storage method relating to the present invention, the flow rate restricting process comprises a process for reducing the target flow rates for all of the group of inactive gas feeding sections by a fixed reduction ratio.

DETAILED DESCRIPTION

Next, embodiments of the present invention as being applied to an article storage facility with a purging function will be explained with reference to the accompanying drawings.

(General Construction)

Figure 1:
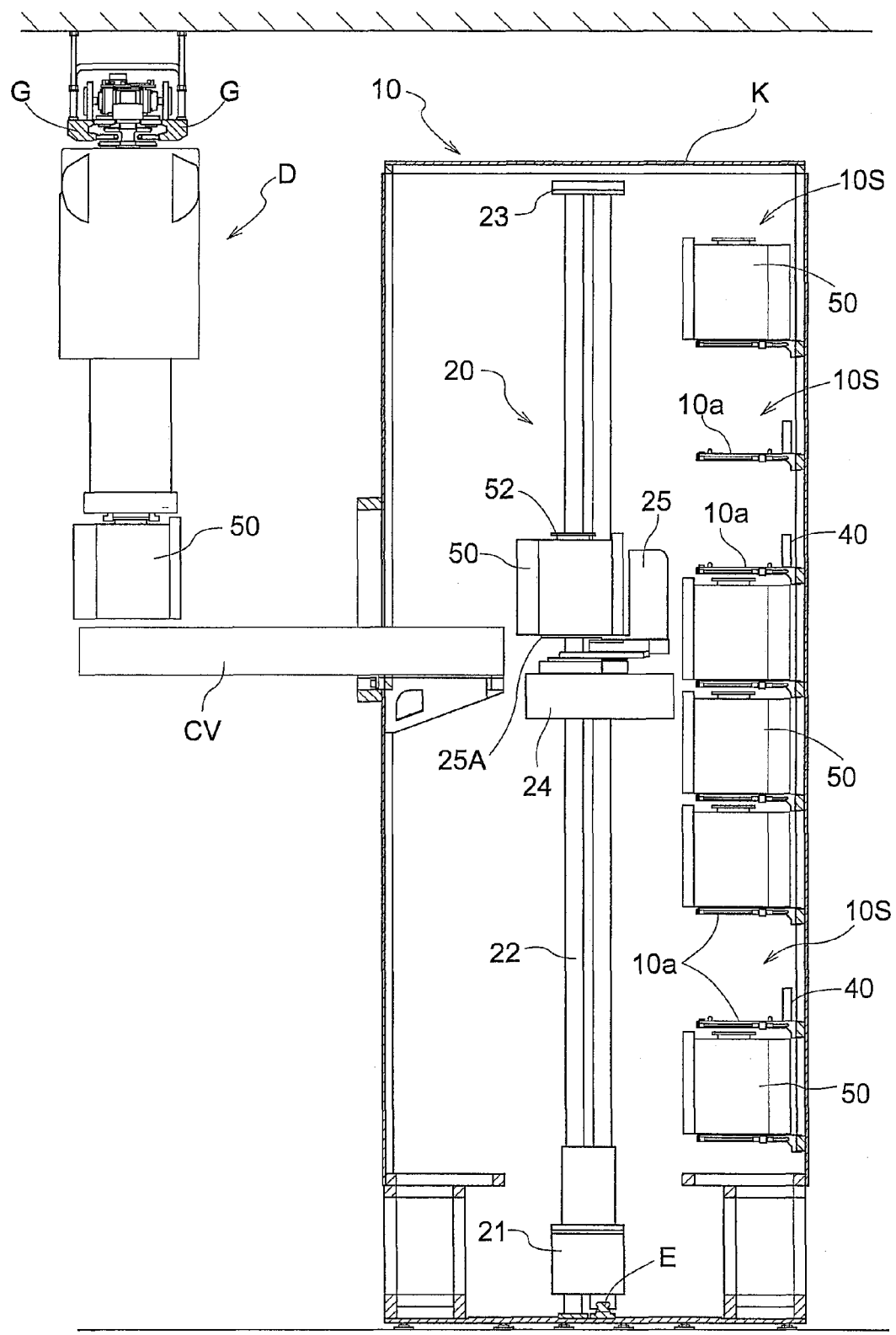
FIG. 1 is a side view in vertical section of an article storage facility.
Figure 2:
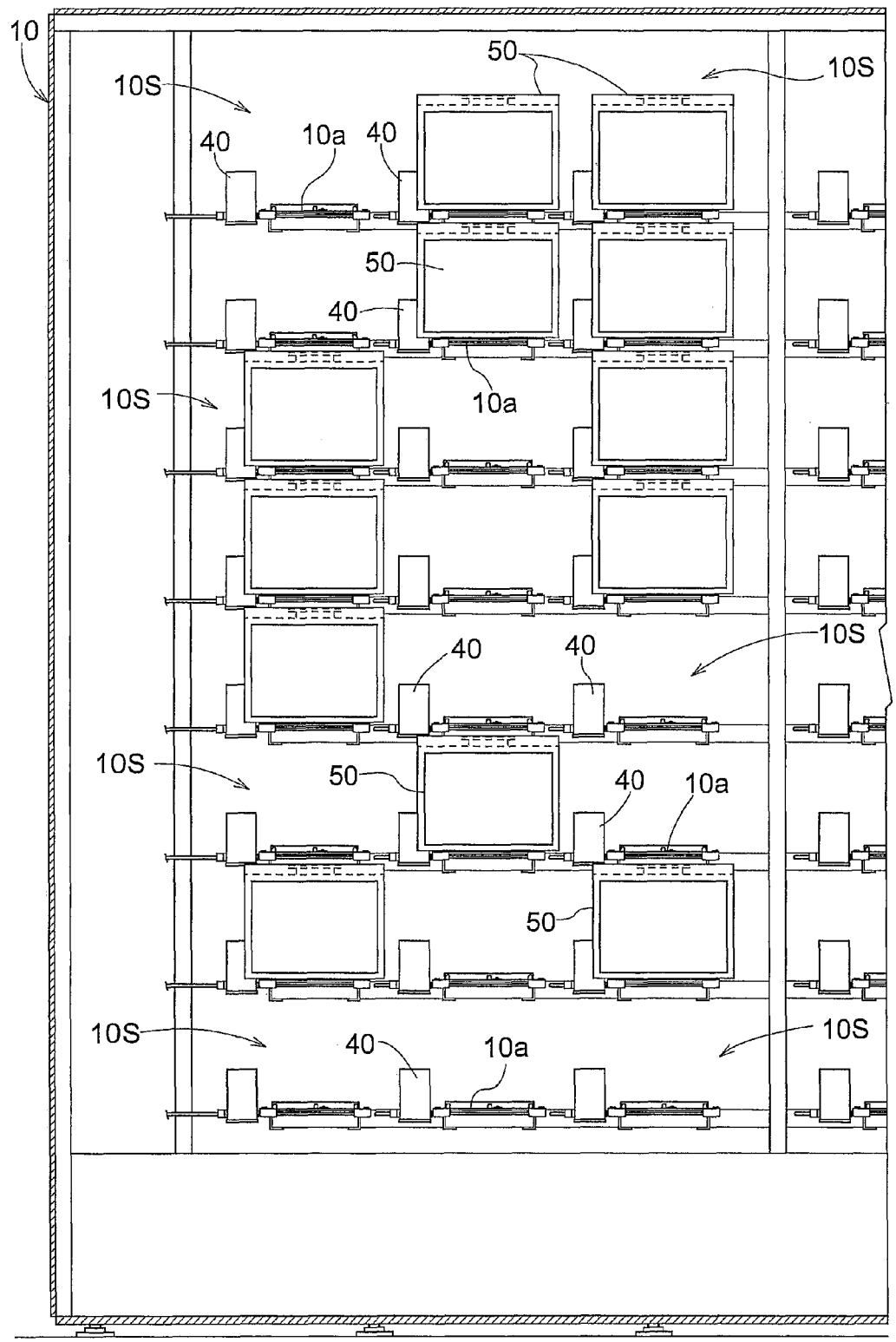
FIG. 2 is a front view in vertical section showing a portion of the facility.

An article storage facility, as shown in FIG. 1 and FIG. 2, includes a storage shelf 10 for storing transport containers 50 (to be referred to shortly as "containers 50" hereinafter) each accommodating a substrate therein under a sealed state, a stacker crane 20 as a transport device, and a carry in/out conveyor CV as a carry in/out section for the containers 50.

The storage shelf 10 and the stacker crane 20 are disposed in an installment space having its outer periphery covered with a wall body K and the carry in/out conveyor CV is disposed to extend through the wall body K.

The storage shelf 10 includes a plurality of storage sections 10S, as support portions for supporting the containers 50, juxtaposed along the vertical direction and the right/left direction, each of the plurality of storage sections 10S being configured to store the container 50. The details of this will be explained later.

And, in the instant embodiment, as shown in FIG. 1, there is mounted a hoist-type transport carriage D which travels along a guide rail G attached to the ceiling portion of a cleanroom in which the article storage facility is installed. By this hoist type transport carriage D, the container 50 can be carried in/out relative to the carry in/out conveyer CV.

(Construction of Container 50)

The container 50 is a gas-sealed container made of synthetic resin in compliance with the SEMI (Semiconductor Equipment and Material Institute) standard and is used for accommodating a semiconductor wafer W (see FIG. 4) as a substrate. This container 50 is referred to as a FOUP (Front Opening Unified Pod). And, though not detailed herein, in the front face of the container 50, there is formed an opening which can be opened/closed with a detachable lid for carrying in/out substrates. In the upper face of the container 50, there is formed a top flange 52 which can be gripped by the hoist type transport carriage D. In the bottom face of the container 50, there are formed three engagement grooves (not shown) engageable by positioning pins 10b (see FIG. 3).

Figure 4:
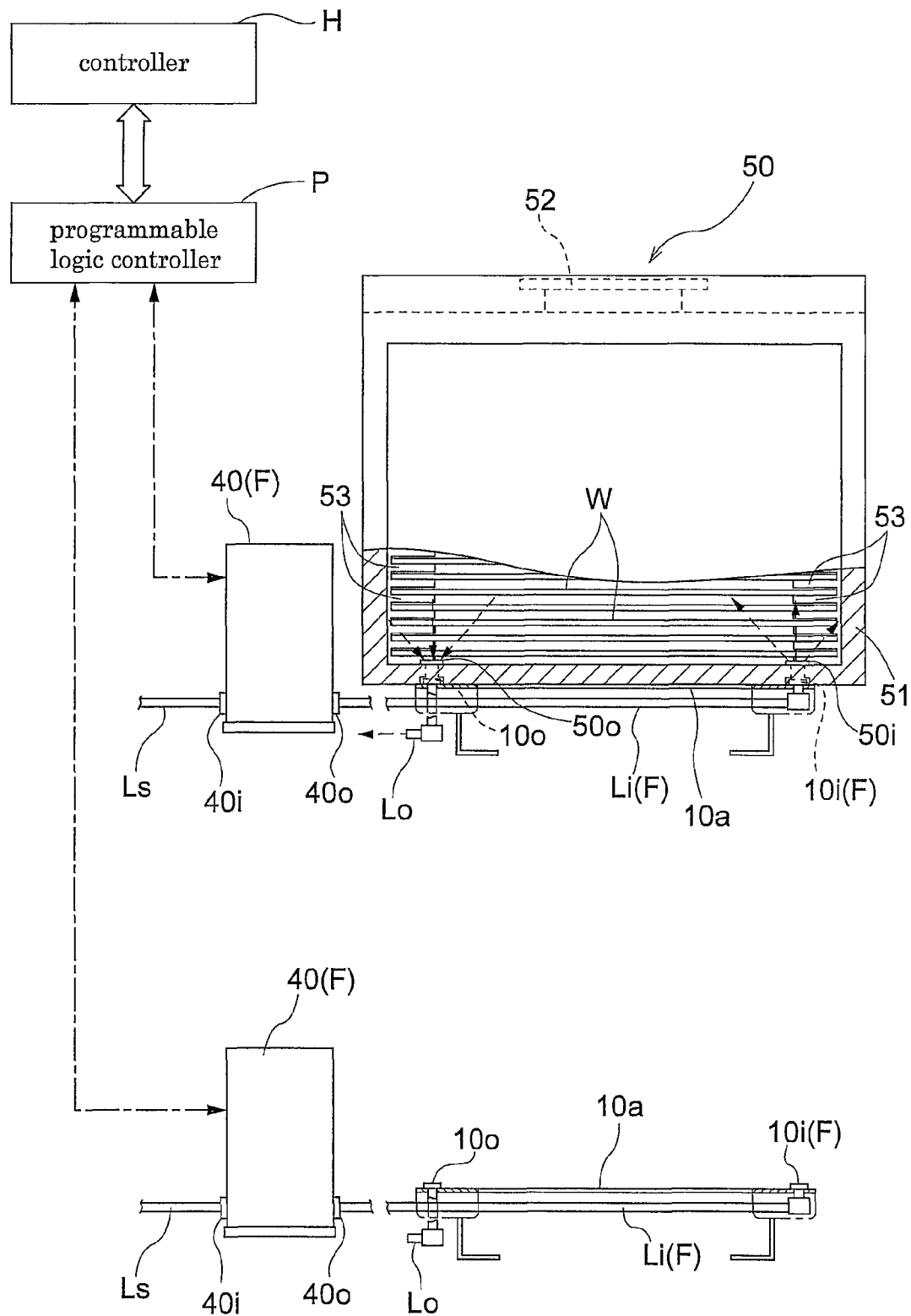
FIG. 4 is a schematic construction diagram showing relationship between a storage section and a transport container.

More particularly, the container 50, as shown in FIG. 4, includes a casing 51 having substrate supports 53 capable of loading a plurality of semiconductor wafers W at different vertical positions therein and an unillustrated lid. The container 50 is configured such that the inner space thereof is sealed gas-tightly when the lid is attached to the casing 51. And, when the container 50 is stored in the storage section 10S, the container 50 is fixed in position by the positioning pins 10b.

Further, as shown in FIG. 4, in the bottom of the container 50, there are provided a gas feed opening 50i for introducing an amount of nitrogen gas as an inactive gas and a gas discharge opening 50o. Though not shown, at the gas feed opening 50i, there is provided an introducing side opening/closing valve: and at the gas discharge opening 50o, there is provided a discharging side opening/closing valve.

The introducing side opening/closing valve is urged in its closing direction by means of an urging member such as a spring. In operation, when the discharge pressure of nitrogen gas fed to the gas feed opening 50i becomes higher than a set valve opening pressure higher than the atmospheric pressure by a set value, the introducing side opening/closing valve is opened by this pressure.

Further, the discharging side opening/closing valve is urged by an urging member such as a spring in the closing direction, so that when the pressure inside the container 50 reaches a pressure higher than a set valve opening pressure higher than the atmospheric pressure by a set value, the valve is opened by this pressure.

(Construction of Stacker Crane 20)

The stacker crane 20 includes a traveling carriage 21 which can run along a traveling rail E installed on the floor on the side of the front face of the storage shelf 10, a mast 22 mounted erect on the traveling carriage 21, and a lift deck 24 which can move up/down as being guided by the mast 22.

Incidentally, though not shown, an upper frame 23 provided at the upper end of the mast 22 is movable as being engaged with an upper guide rail attached to the ceiling of the installment space having its outer periphery covered by the wall body K.

On the lift deck 24, there is mounted a transfer device 25 for transferring the container 50 to/from the storage section 10S.

The transfer device 25 includes a plate-like loading support body 25A which loads and supports the container 50 thereon, with the loading support body 25A being projectable and retractable between a projecting position projecting into the storage section 10S and a retracted position retracted toward the lift deck 24 side. The stacker crane 20 including the transfer device 25 is configured to effect an unloading operation for unloading the container 50 loaded on the loading support body 25A onto the storage section 10S, and a retrieving operation for retrieving the container 50 stored in the storage section 10S, in association with projecting/retracting operations of the loading support body 25A and lifting up/down operations of the lift deck 24.

That is, the container 50 loaded onto the carry in/out conveyer CV by the transport carriage D is conveyed by this carry in/out conveyer CV from the outside to the inside of the wall member K and then conveyed to one of the plurality of storage sections 10S by the stacker crane 20.

Namely, the stacker crane 20 as a transport device is configured to transport the container 50 to the plurality of storage sections 10S.

The stacker crane 20, though not shown, includes a traveling position detector for detecting the traveling position on the traveling passage and a lifting position detector for detecting the lifting position of the lift deck 24. So that, based on detection information of the traveling position detector and the lifting position detector, a crane controller H3 as a controller H for controlling operations of the stacker crane 20 controls the operations of the stacker crane 20.

More particularly, in order to effect a carry-in operation for carrying a container 50 carried into the carry in/out conveyer CV into the storage section 10S and a carry-out operation for carrying the container 50 stored in the storage section 10S out onto the carry in/out conveyer CV, the crane controller H3 controls the traveling operation of the traveling carriage 21, the lifting operation of the lift deck 24 and the projecting/retracting operations of the loading support body 25A of the transfer device 25.

(Construction of Storage Section 10S)

Figure 3:
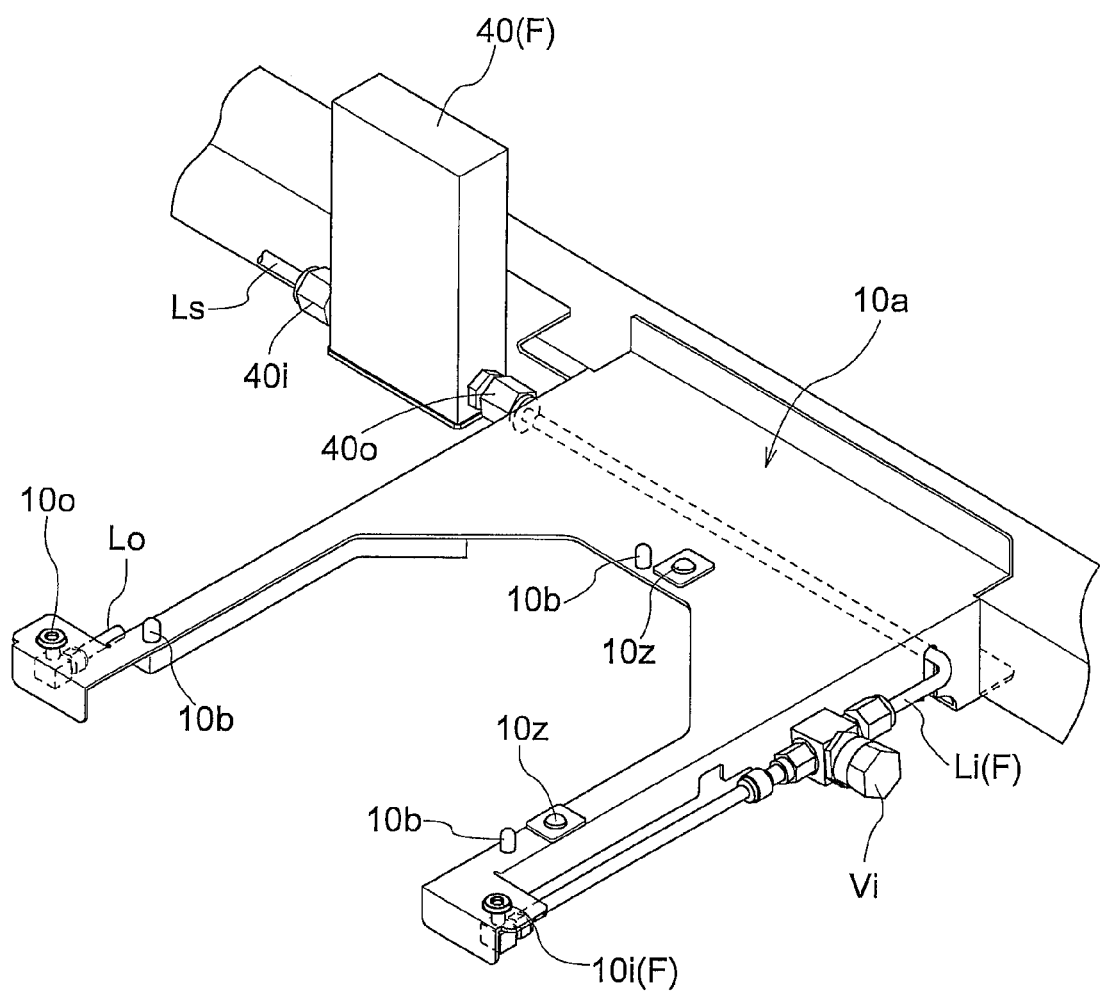
FIG. 3 is a perspective view of a storage section.

As shown in FIG. 3 and FIG. 4, each one of the plurality of storage sections 10S includes a plate-like loading support portion 10a for loading and supporting the container 50 thereon.

This loading support portion 10a has a U-shape as viewed in the plane view thereof so as to form a space for allowing vertical passage of the loading support body 25A of the transfer device 25, and in the upper face, the afore-mentioned positioning pins 10b project upwards therefrom.

Further, the loading support portion 10a includes a pair of load presence sensors 10z for detecting whether the container 50 is loaded or not (that is, whether a container 50 is loaded in the storage section 10S or not). And, detection information thereof are inputted to a purge controller H1 as a controller H (see FIG. 6) for managing the operation of a mass flow controller 40 as a flow rate adjusting device which will be described later.

The loading support portion 10a further includes a discharge nozzle 10i as a discharge opening for feeding nitrogen gas as an inactive gas into the inside of the container 50 and a discharging gas passage body 10o to be passed by a gas discharged from the inside of the container 50. And, to the discharge nozzle 10i, there is connected a feed pipe Li for flowing nitrogen gas from the mass flow controller 40, and to the discharging gas passage body 10o, there is connected a discharge pipe Lo open at its end.

Further, as shown in FIG. 1 and FIG. 2, at a position deep into each storage section 10S as viewed in the plan view and corresponding to the vicinity of the end of the container 50 along the right/left direction of the shelf, there is mounted the mass flow controller 40 for controlling the feeding of nitrogen gas. The deep side of each storage section 10s in the plan view is the side of the end opposite to the opening (inlet/outlet) for carrying in/out the container 50.

The storage sections 10S are disposed on the storage shelf 10 as being distributed to a plurality of layers juxtaposed along the vertical direction. And, the mass flow controller 40 is disposed at a position overlapped in the plan view with a mass flow controller 40 disposed in a storage section 10s of a different layer. The disposing position of the mass flow controller 40 is a position where no loading support portion 10a or a post or the like supporting it is present as viewed in the plan view and also where the container 50 is not present when this container 50 is stored. Therefore, in the vicinity of the mass flow controller 40, there is formed a space which communicates from the lower end to the upper end of the storage shelf 10 and allows passage of air therein along the vertical direction.

With the above, the air flow resulting from the heat generated by the mass flow controller 40 is allowed to flow from the lower end to the upper end of the storage shelf 10 without being hindered by any obstacle. As a result, it is possible to prevent an amount of heat radiated from the mass flow controller 40 from stagnatingly staying there, thus restricting occurrence of a failure such as an erroneous operation of the mass flow controller 40 caused by heat.

Incidentally, the above-described space that allows passage of air allows its downflow with reduced resistance when e.g. the storage shelf 10 is maintained under a clean condition by the downflow of the inactive gas or clean air. In this case too, the mass flow controller 40 will be appropriately cooled by the downflow.

When the container 50 is loaded and supported on the loading support portion 10a, the discharge nozzle 10i is connected under an engaged state to the gas feed opening 50i of the container 50 and the discharging gas passage body 10o is connected under an engaged state to the gas discharge opening 50o of the container 50.

Then, under the condition of the container 50 being loaded and supported on the loading support portion 10a, nitrogen gas is discharged from the discharge nozzle 10i at a pressure higher than the atmospheric pressure by a set value, whereby the gas present inside the container 50 is discharged through the gas discharge opening 50o to the outside and the nitrogen gas can be introduced to the inside of the container 50 through the gas feed opening 50i of the container 50.

In the instant embodiment, mainly, the mass flow controller 40, the feed pipe Li, and the discharge nozzle 10i together constitute an inactive gas feeding section F.

Namely, the inactive gas feeding section F includes the discharge nozzle 10i for discharging the inactive gas and the mass flow controller 40 capable of adjusting the flow rate of the inactive gas to be discharged from this discharge nozzle 10i and this section is configured to feed the inactive gas to the inside of the container 50 stored in the storage section 10S. And, this inactive gas feeding section F is provided for each one of the plurality of storage sections 10S.

Incidentally, as shown in FIG. 3, the feed pipe Li incorporates a manual operation type opening/closing valve Vi, such that a change of condition to stop the feeding of the nitrogen gas may be realized at the time of e.g. an emergency due to malfunctioning of the mass flow controller 40.

(Construction for Feeding Nitrogen Gas)

Figure 5:
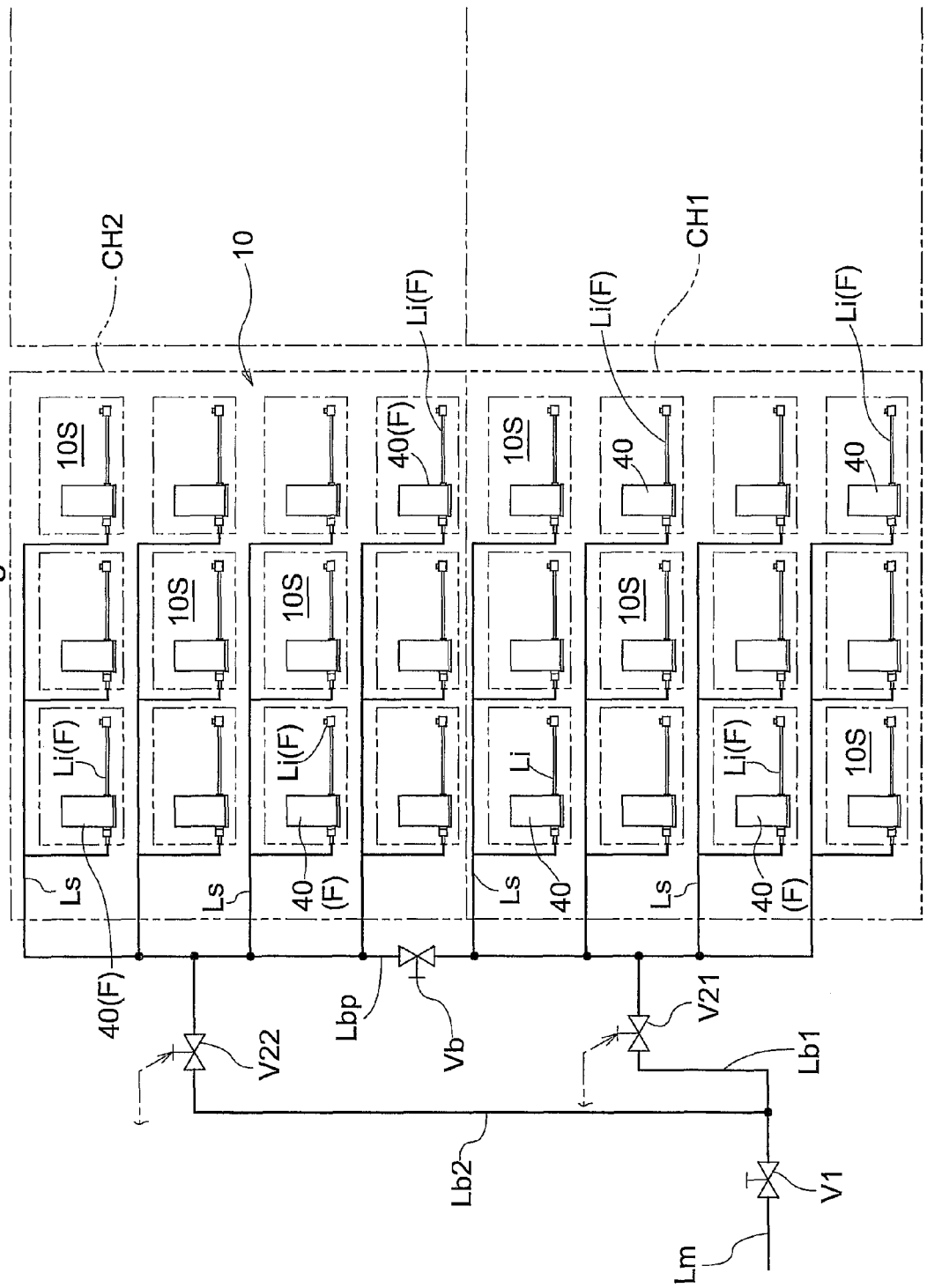
FIG. 5 is a view showing a manner of feeding of inactive gas to a plurality of storage sections.

As shown in FIG. 5, there is provided a source gas feed pipe Lm as a nitrogen gas feed source for feeding nitrogen gas to each of the inactive gas feeding sections F on the storage shelves 10. And, this source gas feed pipe Lm is branched into two parts, i.e. a first branch feed pipe Lb1 and a second branch feed pipe Lb2. Further, the source gas feed pipe Lm incorporates a source gas opening/closing valve V1 for enabling switching between feeding and stop of feeding of nitrogen gas for each one of the storage shelves 10.

Each of the first branch fee pipe Lb1 and the second branch feed pipe Lb2 is further branched into twelve feed pipes Ls. And, each feed pipe Ls is connected to an introducing side port 40i of the mass flow controller 40. In the following discussion, the group of inactive gas feeding sections F fed with the nitrogen gas from the first branch feed pipe Lb1 will be referred to as a first channel (CH1) and the group of inactive gas feeding sections F fed with the nitrogen gas from the second branch feed pipe Lb2 will be referred to as a second channel (CH2).

The first branch feed pipe Lb1 incorporates a first electromagnetic opening/closing valve V21 and the second branch feed pipe Lb2 incorporates a second electromagnetic opening/closing valve V22. And, these valves, i.e. the first electromagnetic opening/closing valve V21 and the second electromagnetic opening/closing valve V22 are electrically connected to the purge controller H1 via an IO extension module A to be described later, so that the purge controller H1 controls opening/closing of the first electromagnetic opening/closing valve V21 and the second electromagnetic opening/closing valve V22.

Further, the first branch feed pipe Lb1 and the second branch feed pipe Lb2 are connected to each other via a bypass pipe Lbp on the downstream sides of the first electromagnetic opening/closing valve V21 and the second electromagnetic opening/closing valve V22. And, the bypass pipe Lpb incorporates a bypass valve Vb which can be opened/closed manually. Hence, when the bypass valve Vb is opened, the first channel CH1 and the second channel CH2 are connected to each other so that nitrogen gas can be fed respectively thereto.

In the instant embodiment, each of the channels CH1, CH2 corresponds to what is referred to as "a group of inactive gas feeding sections F" corresponding to a group of storage sections of the plurality of storage sections. And, each of the first branch feeding pipe Lb1 and the second branch feeding pipe Lb2 corresponds to "a feed source" for feeding nitrogen gas to the group of inactive gas feeding sections F.

(Construction of Mass Flow Controller 40)

As shown in FIG. 3 and FIG. 4, the mass flow controller 40 includes the introducing side port 40i and a discharging side port 40o. To the discharging side port 40o, the feed pipe Li is connected. And, to the introducing side port 40i, there is connected an introducing side pipe Ls for guiding nitrogen gas from the first branch feed pipe Lb1 or the second branch feed pipe Lb2 as the nitrogen gas feed source.

Incidentally, the nitrogen gas feed source includes a governor for adjusting the feed pressure of the nitrogen gas to a set pressure higher than the atmospheric pressure by a set value, and a manual operation type opening/closing valve for allowing/inhibiting feeding of the nitrogen gas, etc.

The mass flow controller 40 includes a flow rate adjusting valve for variably adjusting the flow rate of the nitrogen gas which flows in the inner passage from the introducing side port 40i to the discharging side port 40o, a flow rate sensor for determining the flow rate of the nitrogen gas which flows in the inner passage, and an internal control unit for controlling the operations of the flow rate adjusting valve.

And, the internal control unit is configured to control the flow rate adjusting valve based on the detection information from the flow rate sensor so as to adjust the feed rate to the container 50 to a target flow rate commanded from the aforementioned purge controller H1. That is, the purge controller H1 is configured to control the operations of the mass flow controller 40.

(Construction of Controller H)

Figure 6:
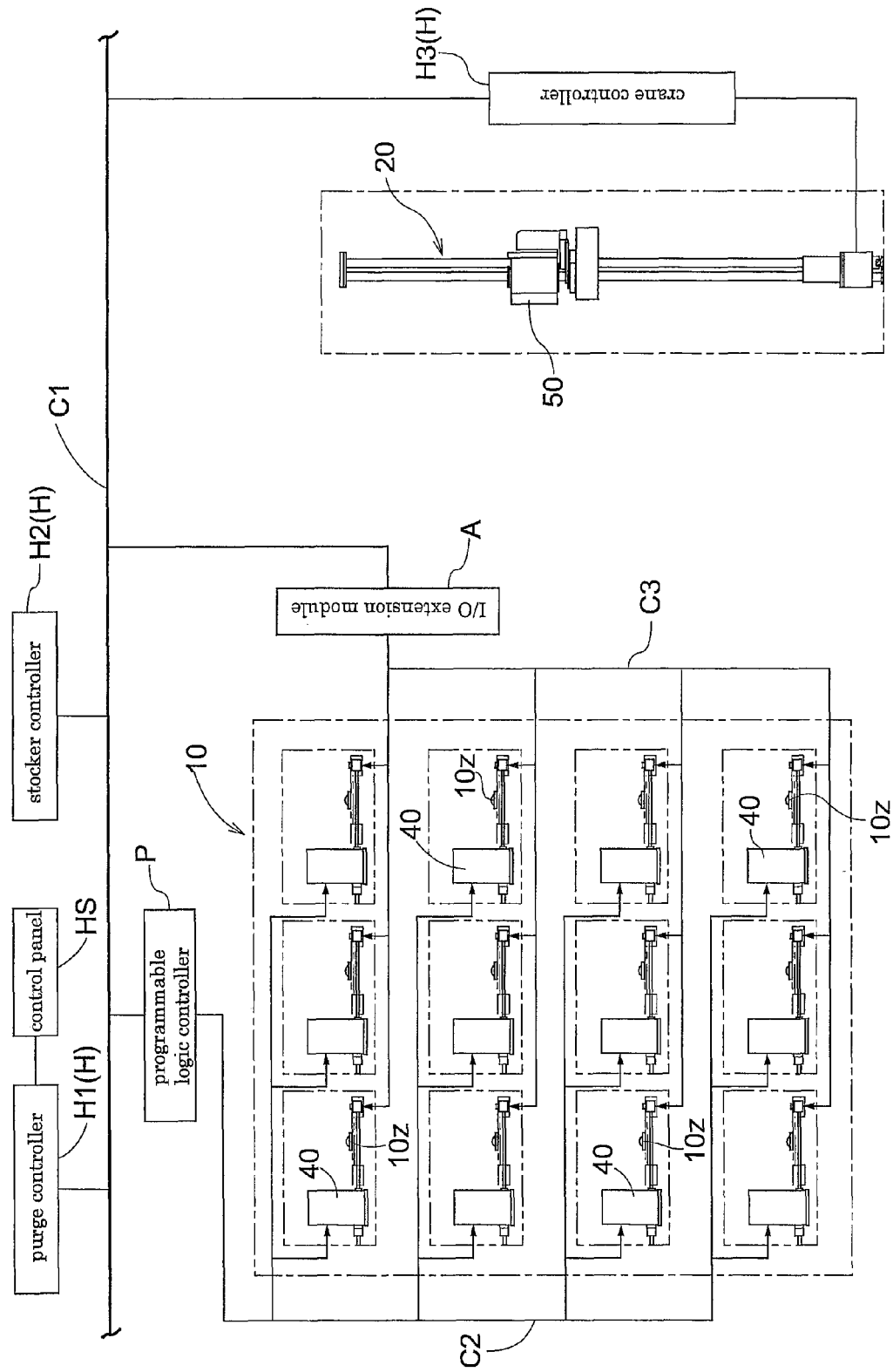
FIG. 6 is a construction diagram of connection to a controller.

As shown in FIG. 6, the controller H includes the purge controller H1 for controlling the mass flow controller 40, a stocker controller H2 for managing e.g. the storage condition of the container 50 on the storage shelf 10, and a crane controller H3 for controlling the operation of the stacker crane 20. The purge controller H1, the stocker controller H2 and the crane controller H3 can comprise e.g. computers for processing information by the stored program method and are connected to each other via a network C1 such as a LAN. Further, a programmable logic controller P and an IO extension module A are connected to the network C1 to be capable of communicating with the controller H.

To the programmable logic controller P, there are connected, via a control bus C2, twelve mass flow controllers 40. Also, to the IO extension module A, there are connected, via respective signal lines C3, load presence sensors 10z corresponding to the storage sections 10S having the twelve mass flow controllers 40.

The purge controller H1 commands, via the programmable logic controller P, a target flow rate to the mass flow controller 40 provided in correspondence with each of the plurality of storage sections 10S.

Incidentally, the controller H is provided with a control console HS for allowing inputs of various kinds of information.

The target flow rate commanded by the purge controller H1 includes, as some non-limiting examples thereof, a target flow rate for storage to be commanded to the mass flow controller 40 in order to introduce nitrogen gas into the container 50 when this container 50 is accommodated in the storage section 10S, a target flow rate for nozzle cleaning to be commanded in order to clean the discharge nozzle 10i immediately before the container 50 is stored in the storage section 10S and a target flow rate for cleaning to be commanded in order to clean the discharge nozzle 10i, the feed pipe Li, etc at the time of e.g. installment of the storage shelf 10.

Figure 7:
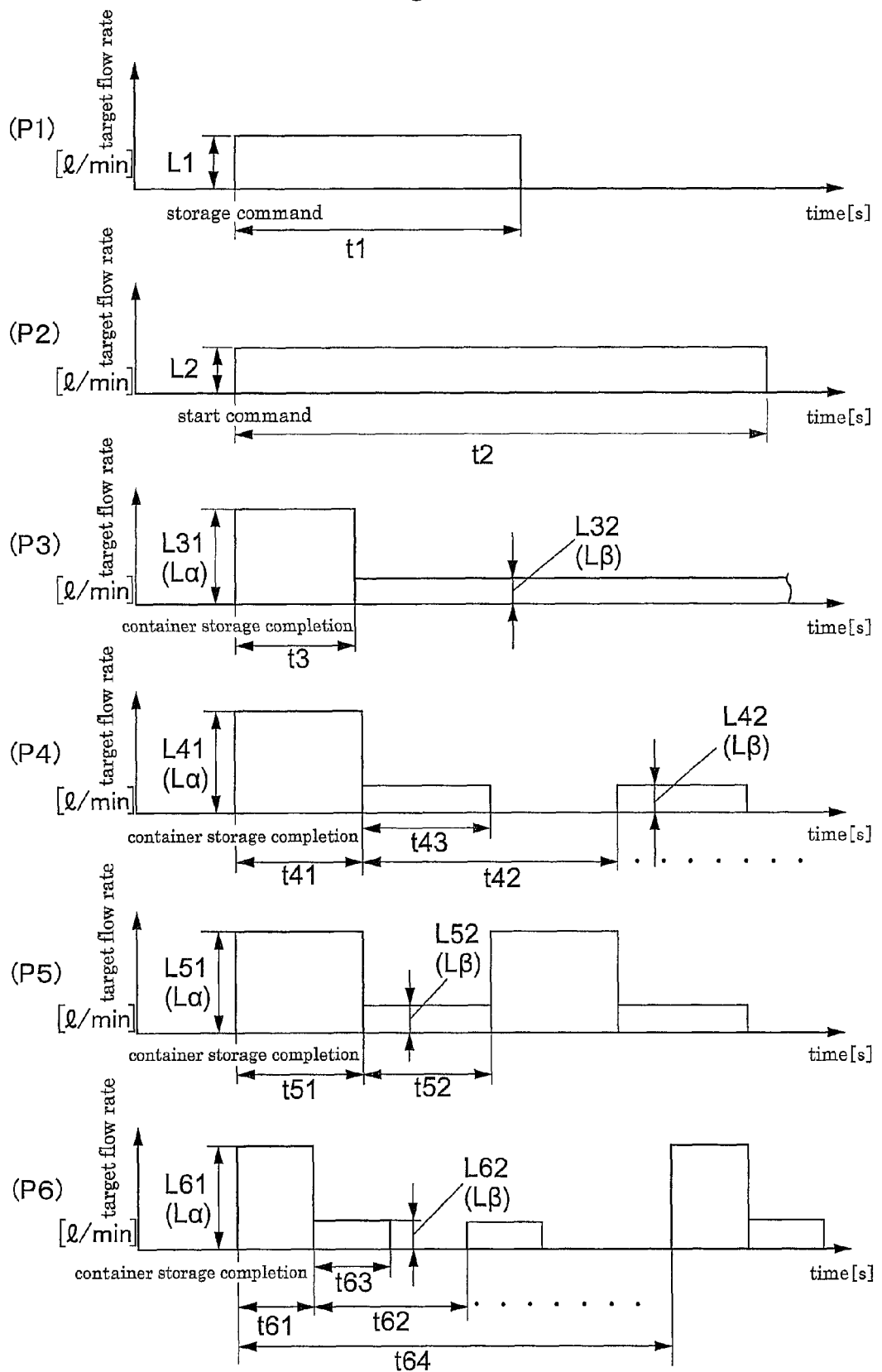
FIG. 7 is an explanatory view illustrating a manner of control of feeding amount of inactive gas.

Namely, the purge controller H1, as shown in FIG. 7, stores or memorizes therein, as a plurality of purge patterns each defining a target flow rate and a feed period, a nozzle purge pattern P1, a cleaning pattern P2 and four storage purge patterns P3-P6.

And, at the time of e.g. installment of the storage shelf 10, when a cleaning start command is issued via the control console HS, the purge controller H1 controls the operation of the mass flow controller 40 according to the cleaning pattern P2. In this, the feeding manner of nitrogen gas will be rendered into a cleaning feed manner as a feeding manner for cleaning the inactive gas feeding section F with feeding of nitrogen gas therethrough and the target flow rate will be set to a flow rate for cleaning and the feed period will be set to a period for cleaning.

Incidentally, the control panel HS is configured to be capable of selecting the inactive gas feeding section(s) F that need to be cleaned, so that the cleaning start command will be issued to the selected inactive gas feeding section(s).

That is, the control panel HS functions as a cleaning commanding device for commanding, in response to a manual operation, a cleaning command for cleaning the inactive gas feeding sections F by feeding of nitrogen gas therethrough. Namely, the control panel HS selects one or some or all of the inactive gas feeding sections of the plurality of inactive gas feeding sections F as specified feeding sections, in response to a manual operation and issues a cleaning start command to the selected specified feeding sections. That is, in the instant embodiment, the control panel HS corresponds to "a specified feeding section selecting section".

In particular, in the instant embodiment, the purge controller H1 is configured to allow feeding of inactive gas by the cleaning flow rate and for the cleaning period in the inactive gas feeding section with no container 50 being stored in the storage section 10S, in response to a cleaning command issued via the control panel HS.

Further, upon completion of carry-in of the container 50 onto the carry in/out conveyer CV, the controller H issues a target flow rate for nozzle cleaning according to the nozzle purge pattern P1.

In the instant embodiment, the controller H is configured to determine the timing of the carry-in of the container 50 onto the carry in/out conveyer CV via communication thereto of a storage command from a carriage controller (not shown) for controlling the operation of the hoist type transport carriage D.

That is, when the transport carriage D has carried in a container 50 on the carry in/out conveyer CV, the carriage controller issues a storage command to the controller H.

Further, in response to detection of the container 50 by two load presence sensors 10z, the controller H issues a target flow rate (feed rate) for storage according to one pattern selected in advance via the control console HS from the four storage purge patterns P3-P6.

Incidentally, the target flow rates and the feed periods according to the nozzle purge pattern P1 and the cleaning pattern P2 are set in advance to standard conditions. On the other hand, the target flow rates and the feed periods according respectively to the four storage purge patterns P3-P6 are set respectively by the user at the time of e.g. installment of the facility. Meanwhile, the standard condition described above can be variably set via the control panel HS as a setting input device.

More particularly, the user will variably set, as pattern specifying parameters via the control console HS, the target flow rate and the feed period according to each of the four storage purge patterns P3-P6 for feeding inactive gas from the inactive gas feeding sections F to the containers 50 and will proceed to experimentally use each of the four storage purge patterns P3-P6, thus setting the target flow rate and the feed period of one preferred pattern from the four storage purge patterns P3-P6, and selecting this preferred pattern. Namely, in the instant embodiment, the control panel HS corresponds to "a setting input device" for manually inputting pattern specifying parameters.

(Purge Patterns)

Next, the nozzle purge pattern P1, the cleaning pattern P2 and the four storage purge patterns P3-P6 respectively will be explained in greater details with reference to FIG. 7.

The nozzle purge pattern P1 is defined as a pattern for feeding nitrogen gas for a period t1 set as pre-storage period from the timing of the issuance of the above-described storage command at a target flow rate L1 set as the target flow rate for nozzle cleaning.

The feed period t1 is set to e.g. 5 seconds and the target flow rate L1 is set to e.g. 30 liters/min.

The cleaning pattern P2 is defined as a pattern for feeding nitrogen gas for a period t2 set as a setting initial feed period from issuance of the cleaning start command via the control console HS at a target flow rate L2 which is set as the target feed rate for cleaning.

The feed period t2 is set to e.g. 1800 seconds and the target flow rate L2 is set to e.g. 20 liters/min.

Regarding each one of the four storage purge patterns P3-P6, as the target flow rate for storage, there are set an initial target flow rate Lα and a steady-state target flow rate Lβ which is lower (smaller) than the initial target flow rate Lα.

The initial target flow rate Lα is set to e.g. 50 liters/min. and the steady-state target flow rate Lβ is set to e.g. 5 liters/min. As described above, the initial target flow rate Lα and the steady-state target flow rate Lβ will be variably set by the user.

And, for each one of the four storage purge patterns P3-P6, in feeding nitrogen gas to the container 50, these patterns are common in that first the initial target flow rate Lα is set as the target flow rate and then the steady-state target flow rate Lβ is set as the target flow rate. Except this, these patterns are set as patterns different from each other.

Hereinafter, the four storage purge patterns P3-P6 will be referred to respectively as the first storage purge pattern P3, the second storage purge pattern P4, the third storage purge pattern P5, and the fourth storage purge pattern P6 and these respective patterns will be explained further.

The first storage purge pattern P3 is defined as a pattern as follows. According to this pattern, during a set feed period t3 from the completion of container storage, i.e. completion of storage of the container 50 at the storage section 10S, the nitrogen gas is fed at the feed rate L31 as the initial target flow rate Lα. Thereafter the nitrogen gas is fed at the feed rate L32 as the steady-state target flow rate Lβ, and this feeding is continued during continued detection of the presence of the container 50 by the pair of load presence sensors 10z.

The set feed period t3 is set to e.g. 5 minutes as the initial value and this set feed period t3 will be variably set by the user as described above. The second storage purge pattern P4 is defined as a pattern as follows. Namely, during a set feed period t41 from the completion of container storage, the nitrogen gas is fed at the feed rate L41 as the initial target flow rate Lα and thereafter the nitrogen gas is fed intermittently at the feed rate L42 as the steady-state target flow rate Lβ, and this intermittent feeding is continued during continued detection of the presence of the container 50 by the pair of load presence sensors 10z.

That is, the second storage purge pattern P4 is set as a pattern according to which after change of the target flow rate from the feed rate L41 as the initial target flow rate Lα to the feed rate L42 as the steady-state target flow rate Lβ, feeding of nitrogen gas is continued for the set feed period t43 and then the feeding is paused for the set pause period and these feeding and pausing are repeated.

Namely, after the change of flow rate from the feed rate L41 as the initial target flow rate Lα to the feed rate L42 as the steady-state target flow rate Lβ, of a repetition cycle t42, during the set feed period t43, nitrogen gas is fed at the feed rate L42 and during the set pause period t42-t43, feeding of nitrogen gas is paused. These operations are effected in repetition during continued detection of the container 50 by the pair of load presence sensors 10z.

Incidentally, the set feed period t41 will be set to e.g. 5 minutes as the initial value and the repetition cycle t42 will be set to e.g. 10 minutes as the initial value. The set feed period t43 will be set to e.g. 5 minutes as the initial value. As described above, the set feed period t41, the repetition cycle t42 and the set feed period t43 will be variably set by the user.

The third storage purge pattern P5 is defined as a pattern as follows. Namely, during the set feed period t51 after completion of storage of container, nitrogen gas is fed at the feed rate L51 as the initial target flow rate Lα. Thereafter, during the set feed period t52, nitrogen gas is fed at the feed rate L52 as the steady-state target flow rate Lβ. This basic pattern is repeated during continued detection of the presence of container 50 by the pair of load presence sensors 10z.

Incidentally, the set feed period t51 will be set to e.g. 5 minutes as the initial value and the set feed period t52 will be set to e.g. 5 minutes as the initial value. As described above, the set feed period t51 and the set feed period t52 will be variably set by the user.

The fourth storage purge pattern P6 is defined as a pattern as follows. Namely, during the set feed period t61 after completion of storage of container, nitrogen gas is fed at the feed rate L61 as the initial target flow rate Lα. Thereafter, during the set feed period t64-t61, nitrogen gas is fed intermittently at the feed rate L62 as the steady-state target flow rate Lβ. This basic pattern is continued during continued detection of the presence of container 50 by the pair of load presence sensors 10z.

That is, in the fourth storage purge pattern P6, there are set a first repetition cycle t64 in which feeding of gas at the feed rate L61 as the initial target flow rate Lα is repeated and a second repetition cycle t62 in which intermittent feeding of nitrogen gas at the feed rate L62 as the steady-state target flow rate Lβ is repeated.

And, at the time of completion of container storage and at the time of start of the first repetition cycle t64, during the set feed period t61, nitrogen gas is fed at the feed rate L61 as the initial target flow rate Lα. And, upon completion of feeding of nitrogen gas at the feed rate L61 as the initial target flow rate Lα, during the set feed period t63, nitrogen gas is fed at the feed rate L62 as the steady-state target flow rate Lβ and feeding of nitrogen gas is paused during the set pause period t62-t63. These operations are repeated in alternation.

Incidentally, the set feed period t61 will be set to e.g. 5 minutes as the initial value and the first repetition cycle t64 will be set to e.g. 30 minutes as the initial value and the second repetition cycle t62 will be set to e.g. 5 minutes as the initial value.

In this fourth storage purge pattern P6, the first repetition cycle t64 and the second repetition cycle t62 too are variably set by the user.

In the instant embodiment, the mode of effecting a purge according to any one of purge pattern of the storage purge patterns P3-P6 corresponds to the container storage mode for feeding inactive gas to the container 50 in a predetermined feed manner.

That is, the purge controller H1 is configured to effect a first feeding step for operating the mass flow controller 40 according to the container storage mode in the inactive gas feeding section F in the storage section 10S storing the container 50 therein.

In the instant embodiment, the inactive gas feeding sections F to be cleaned selected by the control panel HS as a cleaning commanding device corresponds to the specified feeding sections. Further, the mode of effecting purge according to the cleaning pattern P2 corresponds to the specified feeding section feed mode in which mode the inactive gas is fed through the discharge openings 10i thereof in a specified feeding section feed manner.

Namely, the purge controller H1 is configured to effect a second feeding step for controlling the operation of the mass flow controller 40 according to the specified feeding section feed mode in the specified feeding sections selected via the control panel HS.

Further, in the instant embodiment, the initial target flow rate Lα corresponds to the first target flow rate and the steady-state target flow rate Lβ corresponds to the second target flow rate.

That is, the controller H is configured to control the operation of the mass flow controller 40 with switching over between the first feed state for causing the mass flow controller 40 to operate to adjust the feed rate of inactive gas to the container 50 stored in the storage section 10s to the initial target flow rate Lα and the second feed state for causing the mass flow controller 40 to operate to adjust this feed rate to the steady-state target flow rate Lβ which is smaller than the initial target flow rate Lα.

And, the controller H1 is configured to control the operations of the mass flow controller 40 according to the saving feed pattern, which is a pattern for providing the first feed state from the timing of completion of storage of the container 50 in the storage section 10S as the starting point and providing the second feed state thereafter, in the inactive gas feeding section F of this storage section 10S, after the container 50 is transported to the storage section 10S.

(Purge Pattern Selection by Controller H)

In the instant embodiment, the purge controller H1 as the controller H is configured to be capable of memorizing the plurality of purge patterns (P1-P6) including the storage purge patterns P3-P6 as the saving feed patterns.

The control console HS is configured to display information relating to the storage purge patterns P3-P6 under the storage condition of the container 50 being stored in the storage section 10S and to allow manual selection of which storage purge pattern is to be used via an unillustrated input device (a mouse, a keyboard, etc.). That is, the control console HS is provided as a pattern selecting section for the manual selection of which of the storage purge patterns P3-P6 is to be used; and the purge controller H1 is configured to control the operation of the mass flow controller 40 according to a saving feed pattern selected in advance via the control console HS from the plurality of storage purge patterns P3-P6, thus feeding inactive gas into the container 50.

Next, the control executed by the controller H will be explained with reference to FIG. 8 and FIG. 9.

When the system is started up after installment of the article storage facility, the purge controller H1 first executes a purge pattern setting process for causing the user to select and set a purge pattern.

Figure 8:
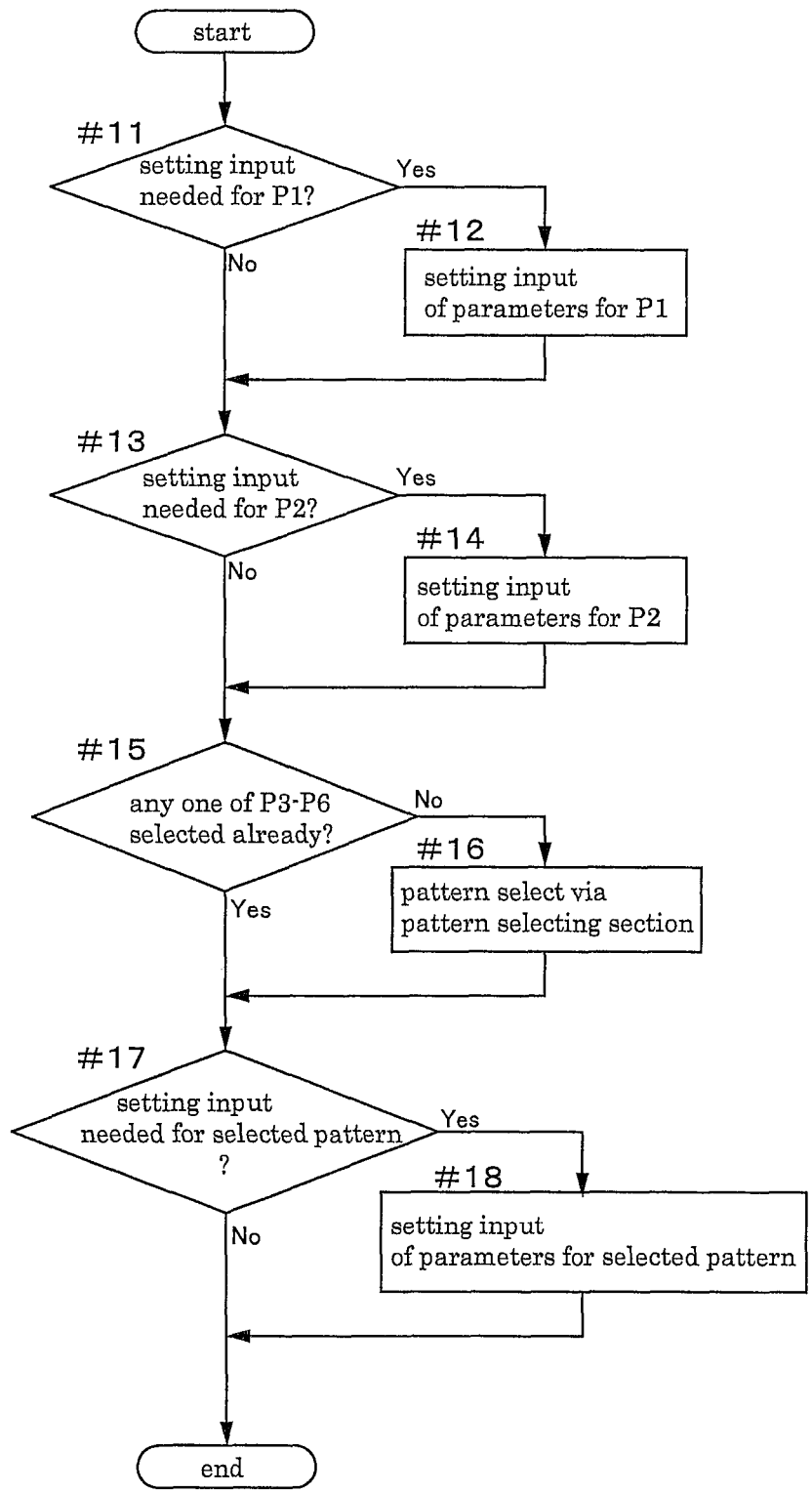
FIG. 8 is a flowchart illustrating a purging pattern setting process.
Figure 9:
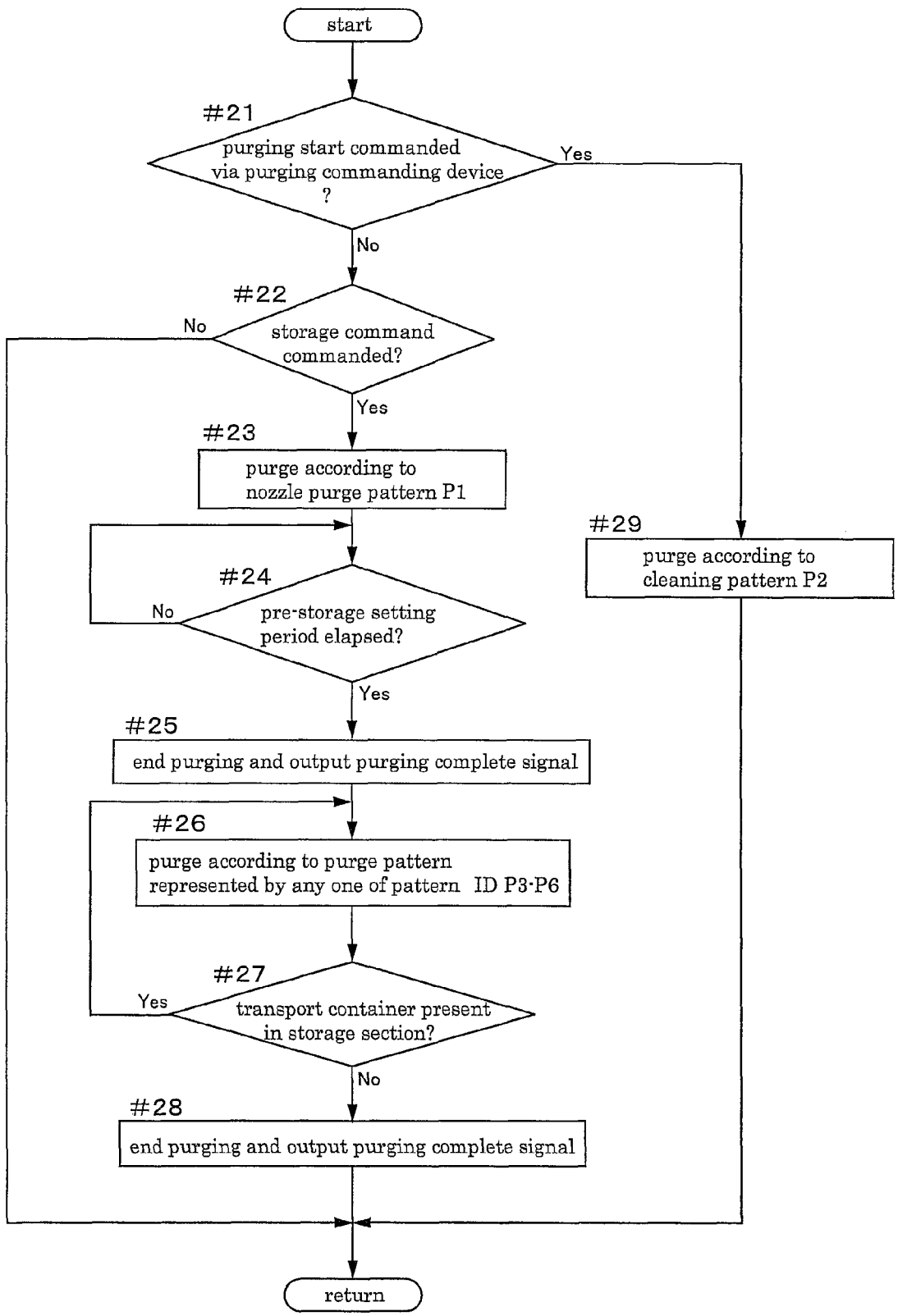
FIG. 9 is a flowchart illustrating an operating process of the facility.

In this purge pattern setting process, as illustrated in FIG. 8, first, the user is prompted to confirm whether setting input of pattern specifying parameters is needed or not for the nozzle purge pattern P1 (step #11). If YES is selected at step #11, the purge controller H1 issues a display command to the control panel HS to display input screen prompting input of a target flow rate (feed rate) and a feed period as the pattern specifying parameters for the nozzle purge pattern P1. Then, on the input screen displayed, the user will input the target flow rate (feed rate) and the feed period (step #12).

On the other hand, if NO is selected at step #11 or in succession to the setting input at step #12, the purge controller H1 will prompt the user to confirm whether setting input of pattern specifying parameters is needed for the cleaning pattern P2 or not (step #13). If YES is selected at step #13, the purge controller H1 issues a display command to the control panel HS to display input screen prompting input of a target flow rate (feed rate) and a feed period as the pattern specifying parameters for the cleaning pattern P2. Then, on the input screen displayed, the user will input the target flow rate (feed rate) and the feed period (step #14).

On the other hand, if NO is selected at step #13 or in succession to the setting input at step #14, the purge controller H1 executes a selection confirmation process for confirming the selection of which of P3-P6 is to be used is made or not regarding the saving purge pattern (step #15). If it is determined at step #15 that the selection of which of P3-P6 is to be used is not made yet, then, the purge controller H1 will issues a display command to the control panel HS to display a selection input screen for prompting selection of which of the saving purge patterns P3-P6 is to be used and on this displayed selection input screen, the user will make selection/input of the purge pattern to be used from the saving purge patterns P3-P6 (step #16).

If YES is determined at step #15 or in succession to completion of setting input at step #16, the purge controller H1 will prompt the user to confirm whether setting input of pattern specifying parameters is needed or not for the selected saving purge pattern (step #17). If YES is selected at step #17, the purge controller H1 will issue a display command to the control panel HS to display an input screen for prompting input of a target flow rate (feed rate) and a feed period as the pattern specifying parameters for the selected purge pattern (any one of P3-P6); and on the displayed input screen, the user will set and input a target flow rate (feed rate) and a feed period (step #18).

Incidentally, the above-described purge pattern setting process will be executed in response also to a user's revised setting command, in addition to the case of system start-up after installment of the article storage facility.

Next, with reference to the flowchart shown in FIG. 9, the flow of process representing operations of the facility after the installment of the article storage facility will be explained.

First, the purge controller H1 determines whether a cleaning start is commanded by the cleaning commanding device (the control panel HS in the instant embodiment) or not (step #21). If it is determined at step #21 that the cleaning start is not commanded, then, the controller determines whether a storage command for storing the container 50 is commanded or not (step #22). If it is determined at step #22 that the storage command is commanded, the purge controller H1 controls the mass flow controller 40 according to the pattern set as the nozzle purge pattern P1, thus cleaning the discharge nozzle 10i (step #23). The purging according to the nozzle purge pattern P1 will be continued for the duration of the feed period t1 as "a pre-storage setting period" (step #24). Then, if it is determined that the feed period t1 has elapsed, the purge controller H1 will issue a purge ending command for ending the purging to the mass flow controller 40, and outputs a purge complete signal to the stocker controller H2 (step #25).

In succession to the above, the purge controller H1 controls the mass flow controller 40 corresponding to the storage section 10S storing the container 50 according to the pattern selected at step #16 (see FIG. 8) thus, feeding nitrogen gas to this container 50 (step #26). The purging operation commanded at step #26 will be continued for the duration of the presence of the container 50 in the storage section 10S (step #27). If it is determined at step #27 that no container 50 is present in the storage section 10S, the purge controller H1 issues a purge ending command for ending the purging to the mass flow controller 40 corresponding to this storage section 10S and outputs a purge complete signal to the stocker controller H2 (step #28).

Further, if it is determined at step #21 that a cleaning start is commanded, the mass flow controller 40 will be controlled according to the pattern set as the cleaning pattern P2, thus cleaning the discharge nozzle 10i and the feed pipe Li, etc. (step #29).

In succession to completion of the process at step #28 or to completion of the process at step #29 or if it is determined at step #22 that no storage command is issued, the above flow will be ended and the process returns.

(Flow Rate Restricting Process)

In the instant embodiment, the purge controller H1 is configured to memorize the maximum allowable flow rate Lmax that can be fed to all the inactive gas feeding sections belonging in the first channel CH1.

And, if the total Ltotal of the target flow rates of nitrogen gas set according to the saving feed pattern for the group of inactive gas feeding sections F (in this embodiment, all the inactive gas feeding sections F belonging in the first channel CH1) exceeds the maximum allowable flow rate Lmax, the purge controller H1 executes the flow rate restricting process. In this embodiment, this flow rate restricting process is a process of reducing the target flow rate for all of the inactive gas feeding sections F of this group. Specifically, the target flow rate is revised according to the following Formula (1).

$$\text{target flow rate} = \text{target flow rate} \times (\text{maximum allowable flow rate } L\text{max})/(\text{total } L\text{total of target flow rates}) \quad (1)$$

More particularly, if the total of the target flow rates of nitrogen gas set according to the saving feed pattern for the group of inactive gas feeding sections F exceeds the maximum allowable flow rate or if there exists an inactive gas feeding section F having a large pipe resistance from the first branch feeding pipe Lb1 to this inactive gas feeding section F and an inactive gas feeding section F having a smaller pipe resistance from the first branch feeding pipe Lb1 to this inactive gas feeding section F so that the inactive gas fed from the first branch feeding pipe Lb1 is caused to flow with priority to the inactive gas feeding section F having the smaller resistance, thus leading to shortage in the flow rate of the inactive gas feeding section F having the large resistance relative to its target feed rate, the purge controller H1 will execute the flow rate restricting process for reducing the target flow rates of inactive gas for all of the group of inactive gas feeding sections F by a fixed reduction ratio.

In the case of the instant embodiment, the reduction ratio will be set so that the total of the target flow rates of all of the group of inactive gas feeding sections F may be equal to the maximum allowable flow rate Lmax.

Incidentally, the foregoing explanation concerns the case directed to the first channel CH1. However, the same arrangements can be provided for the second channel CH2 as well.

Other Embodiments (1) In the foregoing embodiment, there was disclosed an exemplary arrangement wherein the transport container 50 is a FOUP and the substrate to be accommodated is a semiconductor wafer W and the nitrogen gas is fed as the inactive gas into the transport container. However, the embodiment of the present invention is not limited to such arrangement. For instance, the substrate to be accommodated can be a reticle and the transport container 50 can be a reticle container. Further, as the inactive gas to be fed to the transport container, in addition to nitrogen gas, various kinds of gas having low reactivity relative to the accommodated substrate, such as argon gas, can be employed also.

(2) In the foregoing embodiment, there was illustrated the exemplary arrangement that the flow rate detecting device is incorporated in the mass flow controller 40. However, the embodiment of the present invention is not limited to such arrangement. For instance, the flow rate detecting device can be incorporated in the feed pipe Li.

(3) In the foregoing embodiment, there was disclosed the exemplary arrangement wherein the specified feeding section selecting section comprises a cleaning commanding device for manually commanding a cleaning command. However, as the specified feeding section selecting section, it is possible to employ various kinds of selecting device other than such cleaning commanding device. For instance, various kinds of arrangements are conceivable such as an arrangement wherein the specified feeding section selecting section comprises a testing feeding section selecting section for selecting, as the specified feeding sections, the inactive gas feeding sections to be tested for the flowing condition of the inactive gas.

(4) In the foregoing embodiment, there was disclosed the exemplary arrangement wherein which of the storage purge patterns P3-P6 is to be used is selected manually with using the control panel HS as a pattern selecting section. However, the embodiment of the present invention is not limited to such arrangement. For instance, an alternative arrangement is possible wherein the purge controller H1 determines which of the storage purge patterns P3-P6 is to be used based on the type or the state of the substrate accommodated in the container 50 and which of the storage purge patterns P3-P6 is to be used is selected based on the result of this determination. In this case, the pattern selecting section is provided as a program module in the purge controller H1.

(5) In the foregoing embodiment, as the pattern specifying parameters for the storage purge patterns P3-P6, the feed period of feeding the inactive gas from the inactive gas feeding section F to the container 50 and the feed rate of feeding the inactive gas from the inactive gas feeding section F to the container 50 are provided to be variably set. In addition to the storage patterns P3-P6, the feed period and the feed rate can be provided to be variably set as pattern specifying parameters for the nozzle purge pattern P1 and the cleaning pattern P2 also.

(6) In the foregoing embodiment, the purge controller H1 is configured to reduce the target flow rates for all of the group of inactive gas feeding sections F by a fixed reduction ratio in the flow rate restricting process. However, the embodiment of the present invention is not limited to such arrangement. For instance, an alternative arrangement will be possible wherein the target flow rate is reduced only for those inactive gas feeding sections F having the initial target flow rate Lα being set as the feed rate value. According to a further alternative arrangement, an inactive gas feeding section F corresponding to a container 50 having lower possibility of contamination or deterioration of the semiconductor wafer W even with reduced feed rate of inactive gas thereto will be selected and the target flow rate for this section is reduced. In these ways, the method of selecting the inactive gas feeding section(s) F to be subjected to target flow rate reduction can vary in many ways, as long as the influence thereof to the semiconductor wafer W accommodated in the container 50 is confined within the permissible range.

(7) In the foregoing embodiment, as the flow rate restricting process, the target flow rate is revised according to Formula (1). However, the embodiment of the present invention is not limited to such arrangement. For instance, the reduction ratio can be fixed to a predetermined value (e.g. 15%) and in case the total Ltotal of the target flow rates of nitrogen gas set according to the saving feed pattern for the group of inactive gas feeding sections F exceeds the maximum allowable flow rate Lmax, the flow rates for all of the group of inactive gas feeding sections F may be reduced by the above predetermined value.

(8) In the foregoing embodiment, the target flow rate of inactive gas to be fed to the container 50 is set in two steps, i.e. the first target flow rate and the second target flow rate smaller than the first target flow rate. However, the embodiment of the present invention is not limited to such arrangement. For instance, the target flow rate of inactive gas can be set in three or more different steps, so that the mass flow controller 40 may be operated with switching from the first target flow rate to the second target flow rate and then from the second target flow rate to the third target flow rate (or another or other target flow rate(s)) one after another.

(9) In the foregoing embodiment, in case the total Ltotal of the target flow rates of nitrogen gas set according to the saving feed pattern for the group of inactive gas feeding sections F exceeds the maximum allowable flow rate Lmax, the purge controller H1 executes the flow rate restricting process for reducing the target flow rates for all of the group of inactive gas feeding sections F. However, the embodiment of the present invention is not limited to such arrangement. For instance, an alternative arrangement will be possible as follows. Namely, the nitrogen gas is fed without changing the target flow rates. Then, if the mass flow controller 40 outputs an error as a flow rate shortage condition, this error will be reset and also the purge controller H1 will command the mass flow controller 40 to reduce the target flow rates of inactive gas for one or some or all of the group of inactive gas feeding sections F.

(10) In the foregoing embodiment, twelve inactive gas feeding sections F fed with nitrogen gas from the first branch feed pipe Lb1 are set as the first channel CH1 and twelve inactive gas feeding sections F fed with nitrogen gas from the second branch feed pipe Lb2 are set as the second channel CH2; and in case the total Ltotal of the target flow rates of nitrogen gas set according to the saving feed pattern for the group of inactive gas feeding sections exceeds the maximum allowable flow rate Lmax, the purge controller H1 executes the flow rate restricting process for reducing the target flow rates for all of the group of inactive gas feeding sections F. However, the embodiment of the present invention is not limited to such arrangement. For instance, both the twelve inactive gas feeding sections F fed with nitrogen gas from the first branch feed pipe Lb1 and the twelve inactive gas feeding sections F fed with nitrogen gas from the second branch feed pipe Lb2 may be set as "a group of inactive gas feeding sections F". Further, in the foregoing embodiment, there was disclosed an exemplary arrangement wherein two channels are provided. However, there may be provided a single channel or three or more channels. Further, in the case of the arrangement of providing only one channel, the feed pipe Ls may be branched from the source gas feed pipe Lm.

(11) In the foregoing embodiment, as storage sections for storing containers 50, the storage sections 10S of the storage shelves 10 are disclosed as the example thereof. However, the storage sections may be storage sections provided on a lateral side of the guide rail G of the hoist type transport carriage D.

(12) In the foregoing embodiment, there were disclosed the four storage purge patterns P3-P6 as examples. Instead, as the storage purge pattern, various patterns can be used such as a pattern for feeding inactive gas intermittently at the initial target flow rate Lα.

The invention claimed is:

1. An article storage facility comprising:
a plurality of storage sections each storing a transport container accommodating a substrate therein;
a transport device for transporting the transport containers to the plurality of storage sections;
an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting a flow rate of the inactive gas to be discharged via the discharge opening;
a controller for controlling operations of the transport device and the flow rate adjusting device; and
a specified feeding section selecting section for selecting one or some or all of the plurality of inactive gas feeding sections as specified feeding sections;
wherein for the inactive gas feeding sections of the storage sections storing the transport containers therein, the controller causes the flow rate adjusting devices to be operated according to a container storage mode in which mode the inactive gas is fed to the transport container in a predetermined feed manner; and
for the specified feeding sections selected by the specified feeding section selecting section, the controller causes the flow rate adjusting devices to be operated according to a specified feeding section feed mode in which mode the inactive gas is fed through the discharge openings thereof in a specified feeding section feed manner.

2. The article storage facility according to claim 1, wherein the manner of feeding the inactive gas through the inactive gas feeding section for cleaning thereof is a cleaning feed manner; and
the specified feeding section selecting section comprises a cleaning commanding device for commanding manually a cleaning command for feeding the inactive gas in the cleaning feed manner.

3. The article storage facility according to claim 1, wherein:
the controller is configured to be switchable between a first feed state for operating the flow rate adjusting device to adjust a feed rate of the inactive gas feeding section to a first target flow rate value and a second feed state for operating the flow rate adjusting device to adjust the feed rate of the inactive gas feeding section to a second target flow rate value which is smaller than the first target flow rate value; and
when the transport container is transported to the storage section, the operation of the flow rate adjusting device is controlled in the inactive gas feeding section of the storage section according to a saving feed pattern in which the first feed state is set from the timing of completion of storage of the transport container in the storage section as the starting point and the second feed state is set thereafter.

4. The article storage facility according to claim 3, wherein:
the controller is configured to be capable of memorizing a plurality of saving feed patterns;
there is provided a pattern selecting section for selecting which one of the plurality of saving feed patterns is to be used under the storage condition of the transport container: and
the controller is configured to control the operation of the flow rate adjusting device according to a saving feed pattern selected by the pattern selecting section from the plurality of saving feed patterns.

5. The article storage facility according to claim 4, wherein the pattern selecting section is configured to allow manual selection of which one of the plurality of saving feed pattern is to be used.

6. The article storage facility according to claim 4, wherein there is provided a setting input device for manually setting and inputting pattern specifying parameters for specifying the saving feed pattern, the pattern specifying parameters allowing variable setting of a feed period of feeding the inactive gas to the transport container from the inactive gas feeding section and a feed rate for feeding the inactive gas to the transport container from the inactive gas feeding section.

7. The article storage facility according to claim 3, wherein:
a feed source of the inactive gas is provided to feed the inactive gas to a group of the inactive gas feeding sections corresponding to a group of storage sections of the plurality of storage sections;
there is set a maximum allowable flow rate that can be fed from the feed source to the group of inactive gas feeding sections; and
the controller is configured to execute a flow rate restricting process for reducing the target flow rates of the inactive gas for one or some or all of the group of inactive gas feeding sections in case the total of the target flow rates of the inactive gas for the group of inactive gas feeding sections exceeds the maximum allowable flow rate.

8. The article storage facility according to claim 7, wherein the controller is configured to reduce the target flow rates for all of the group of inactive gas feeding sections by a fixed reduction ratio.

9. An article storage method utilizing an article storage facility, the method comprising the steps of providing an article storage facility which comprises:
- a plurality of storage sections each storing a transport container accommodating a substrate therein;
- a transport device for transporting the transport containers to the plurality of storage sections;
- an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting the flow rate of the inactive gas to be discharged via the discharge opening;
- a controller for controlling operations of the transport device and the flow rate adjusting device; and
- a specified feeding section selecting section for selecting one or some or all of the plurality of inactive gas feeding sections as specified feeding sections;
- wherein the method further comprises the following steps as steps executed by the controller;
- executing a first feeding step for the inactive gas feeding sections of the storage sections storing the transport containers therein for causing the flow rate adjusting devices to be operated according to a container storage mode in which mode the inactive gas is fed to the transport container in a predetermined feed manner; and
- executing a second feeding step for the specified feeding sections selected by the specified feeding section selecting section for causing the flow rate adjusting devices to be operated according to a specified feeding section feed mode in which mode the inactive gas is fed through the discharge openings thereof in a specified feeding section feed manner.

10. The article storage method according to claim 9, wherein:
the manner of feeding the inactive gas through the inactive gas feeding section for cleaning thereof is a cleaning feed manner; and
the specified feeding section selecting section comprises a cleaning commanding device for commanding manually a cleaning command for feeding the inactive gas in the cleaning feed manner.

11. The article storage method according to claim 9, wherein:
here are provided a first feed state for operating the flow rate adjusting device to adjust the feed rate of the inactive gas feeding section to a first target flow rate value and a second feed state for operating the flow rate adjusting device to adjust the feed rate of the inactive gas feeding section to a second target flow rate value which is smaller than the first target flow rate value; and
at the first feeding step, when the transport container is transported to the storage section, the operation of the flow rate adjusting device is controlled in the inactive gas feeding section of the storage section, according to a saving feed pattern in which the first feed state is set from the timing of completion of storage of the transport container in the storage section as the starting point and the second feed state is set thereafter.

12. The article storage method according to claim 11, wherein:
the controller is configured for memorizing a plurality of saving feed patterns;
the article storage facility further includes a pattern selecting section for selecting which one of the plurality of saving feed patterns is to be used under the storage condition of the transport container: and at the first feeding step, the operation of the flow rate adjusting device is controlled according to a saving feed pattern selected by the pattern selecting section from the plurality of saving feed patterns.

13. The article storage method according to claim 12, wherein the pattern selecting section is configured to allow manual selection of which one of the plurality of saving feed pattern is to be used.

14. The article storage method according to claim 12, wherein the article storage facility further includes a setting input device for manually setting and inputting pattern specifying parameters for specifying the saving feed pattern, the pattern specifying parameters allowing variable setting of a feed period of feeding the inactive gas to the transport container from the inactive gas feeding section and a feed rate for feeding the inactive gas to the transport container from the inactive gas feeding section.

15. The article storage method according to claim 11, wherein:
the article storage facility further includes a feed source of the inactive gas to feed the inactive gas to a group of the inactive gas feeding sections corresponding to a group of storage sections of the plurality of storage sections;
there is set a maximum allowable flow rate that can be fed from the feed source to the group of inactive gas feeding sections; and
at the first feeding step, a flow rate restricting process for reducing the target flow rates of the inactive gas for one or some or all of the group of inactive gas feeding sections is executed in case the total of the target flow rates of the inactive gas for the group of inactive gas feeding sections exceeds the maximum allowable flow rate.

16. The article storage method according to claim 15, wherein the flow rate restricting process comprises a process for reducing the target flow rates for all of the group of inactive gas feeding sections by a fixed reduction ratio.

* * * * *